United States Patent [19]
Kornrumpf

[11] Patent Number: 5,345,205
[45] Date of Patent: Sep. 6, 1994

[54] COMPACT HIGH DENSITY INTERCONNECTED MICROWAVE SYSTEM

[75] Inventor: William P. Kornrumpf, Albany, N.Y.

[73] Assignee: General Electric Company, Schenectady, N.Y.

[21] Appl. No.: 504,753

[22] Filed: Apr. 5, 1990

[51] Int. Cl.$^5$ .............................. H01P 3/08; H05K 1/00
[52] U.S. Cl. ............................... 333/246; 361/749; 29/829
[58] Field of Search ................ 333/33, 246, 247; 361/398, 400; 29/829, 835, 831; 343/200 MS File; 342/175

[56] References Cited

U.S. PATENT DOCUMENTS

| | | | |
|---|---|---|---|
| 3,152,288 | 10/1964 | Mittler | 361/398 X |
| 3,248,779 | 5/1966 | Yuska et al. | 361/398 X |
| 3,766,439 | 10/1973 | Isaacson | 361/398 X |
| 3,873,889 | 3/1975 | Leyba | 361/398 X |
| 3,971,127 | 7/1976 | Giguere et al. | 361/398 X |
| 4,490,721 | 12/1984 | Stockton et al. | 343/700 MS |
| 4,495,546 | 1/1985 | Nakamura et al. | 361/398 |
| 4,591,814 | 5/1986 | Ito et al. | 361/398 X |
| 4,716,259 | 12/1987 | Tokura et al. | 361/398 X |
| 4,792,879 | 12/1988 | Baukrecht et al. | 361/398 X |
| 4,816,836 | 3/1989 | Lalezari | 343/700 MS |
| 4,967,201 | 10/1990 | Rich, III | 342/175 |
| 5,005,019 | 4/1991 | Zaghloul et al. | 343/700 MS |

*Primary Examiner*—Gregory C. Issing
*Attorney, Agent, or Firm*—Robert Ochis; Geoffrey Krauss

[57] ABSTRACT

A multimodule microwave system is assembled in a physically compact, high reliability manner employing a high density interconnect structure to interconnect the different modules of a microwave system by rendering the portion of the interconnect structure between modules flexible and by folding the interconnect structure on appropriate sized mandrels between the modules to place the modules in a multi-tier physical stack. Shielding and hermetic packaging may also be provided.

26 Claims, 10 Drawing Sheets

COMPACT HIGH DENSITY INTERCONNECTED MICROWAVE SYSTEM

RELATED APPLICATIONS

The present invention is related to U.S. Pat. No. 5,206,712, entitled, "A Building Block Approach to Microwave Modules" by W. P. Kornrumpf, et al., application Ser. No. 504,821 now abandoned, entitled, "High Density Interconnected Microwave Circuit Assembly" by W. P. Kornrumpf, et al. and application Ser. No. 07/504,803, entitled, "Microwave Component Test Method and Apparatus" by W. P. Kornrumpf, et al., application Ser. No. 07/504,769, now abandoned entitled, "A Flexible High Density Interconnect Structure and Flexibly Interconnected System", by C. W. Eichelberger, et al. and application Ser. No. 07/504,748, entitled, "Microwave Component Having Tailored Operating Characteristics and Method of Tailoring" by W. P. Kornrumpf, et al., each of which is being filed concurrently herewith and each of which is incorporated herein by reference in its entirety.

BACKGROUND OF THE INVENTION

1. Field of the Invention

The present invention relates to the field of microwave circuits, and more particularly, to interconnection of monolithic microwave integrated circuits and/or other active and passive components into microwave systems.

2. Background Information

Microwave systems are often composed of monolithic microwave integrated circuits (MMICs), other active microwave devices such as GaAs transistors, passive microwave components and other non-microwave components such as logic and control structures.

A monolithic microwave integrated circuit or MMIC is an integrated circuit which is designed to operate at microwave frequencies. MMICs are normally fabricated in GaAs because of the much higher potential operating frequency which GaAs provides as compared to silicon. A typical MMIC may include one or more amplifiers, some passive components and one or more feedback loops which provide feedback from the output of an amplifier or circuit to establish a desired transfer function for that circuit.

It is known in the art to fabricate microwave systems from a variety of such components by providing a ceramic substrate having microstrip RF circuitry, DC supply lines (conductors), logic lines, control lines and contact pads fabricated thereon and by attaching devices and components such as MMICs, GaAs transistors, other microwave and supporting components to the substrate and connecting them to the circuitry on the substrate using wire bonds or tab interconnections.

Such fabrication techniques have a number of disadvantages. Thin and thick film methods of fabricating circuitry on ceramic substrates have tolerance limitations which prevent such structures from being produced with microwave characteristics which are repeatable with close tolerances. Consequently, there is substrate-to-substrate variation in the microwave characteristics of such nominally identical substrates. Further, the active microwave components such as MMICs and GaAs transistors themselves have fabrication tolerances which result in variations in operating characteristics from device to device. Further, in such structures, impedance discontinuities and mismatches are normal at the edges of MMICs and GaAs transistors. These impedance discontinuities vary with the actual placement of the chips on the surface of or in cavities in the ceramic substrate. This is because slight changes in the positioning of such devices change both the lengths of the gaps between the device and the substrate and the alignment of the device structure with the substrate structure. Further, these physical assembly tolerances result in variable interconnect bond lengths, resulting in variable inductances and consequently, varied circuit performance. These impedance mismatches also vary with actual component and substrate impedance values. Further, these and other fabrication-tolerance-induced differences in impedances result in reflections and other undesirable operational effects which degrade system operating characteristics. The cumulative effect of these differences is a wide range of system operating characteristics. Consequently, assembly of a microwave system from such components is a relatively low yield process in which many of the resulting systems do not meet specifications. A significant contributor to this low yield is the fact that many active microwave components cannot readily be accurately tested over their full expected operating frequency and power ranges in a non-destructive manner because of the difficulty of coupling such components to a test system. Consequently, many components which pass preassembly testing do not in reality meet specifications.

As the desired operating frequency of such microwave systems has increased from the neighborhood of 2 GHz to still higher frequencies in the range from 8 GHz to 16 GHz, or more, the problem of thin film and thick film fabrication tolerances and component testing have become ever more vexing.

Many MMICs and other active microwave devices include delicate structures which can easily be damaged or destroyed. These include conductors which are spaced from the surface of the GaAs by an air gap—a structure which is known as an "air bridge". Air bridges are used in these MMICs in order to provide the MMIC with particular desired operational characteristics. These delicate structures severely limit the assembly techniques which can be used to connect these devices into microwave systems. Further, such components are quite sensitive to the placement near their surfaces of conductors or dielectric materials having dielectric constants of more than one, especially in the vicinity of inductors, air bridges and field effect device gate regions.

In digital systems, individual chips can be extensively tested using wafer probe and other test systems before being committed to assembly into individual packages. After packaging, they can be further tested prior to assembly into a system. As a result, yield at system assembly is normally quite high. It is this assurance of successful assembly of digital components into an operative final system which has made feasible the provision of microcomputers and other digital systems at cost-for-performance prices which were unimaginable a decade ago.

Such pre-packaging has been impossible with active microwave devices because the losses and other penalties which packaging introduces are worse than the disease packaging would be intended to cure. Consequently, for microwave systems, post-packaging testing is not available at a component level as a final-assemblyyield-enhancement mechanism. Even full testing of components at a wafer level is not normally feasible because of the relatively large probe which is needed to provide an impedance match to the MMICs or other devices under test. However, the problem of low final yield has led to the design of some active microwave components for testing with so-called co-planar probe such as those built by Cascade Microtech. This requires that the chips be made over-sized in order to provide space on their upper surface for a microwave port having a signal conductor in the middle and two true ground conductors symmetrically disposed on opposite sides of that signal conductor. This structure is required for a co-planar probe to be connected to this microwave port in a well-matched, repeatable manner. The provision of a true ground on the upper surface of a microwave chip is not a simple matter at microwave frequencies (unlike the situation with digital chips which typically operate at frequencies of less than 50 MHz). Generally, this requires the use of a metal connection between the front and back surfaces of the chip. Such metal connections can be provided by plated through holes, but the provision of plated through holes increases the complexity of the fabrication process and decreases yield. Even those chips which are designed for co-planar probing cannot be tested at full power across their full operative range with a co-planar probe because of the poor thermal conductivity of MMICs. Consequently, design of a microwave device for co-planar probing has its own associated penalties such as increased size, increased process complexity, lower process yield and still suffers from a lack of complete assurance that test results will correlate with system performance.

A significant problem with the low yield of fully assembled systems is that such structures cannot be effectively reworked to replace faulty components because the component's connections cannot be removed in a non-destructive manner. Consequently, systems which are out of specification when assembled must be scrapped. Alternatively, if the microwave module is designed to allow rework, rework-induced damage is common, with a consequent limited reworked-induced increase in yield.

Thus, there is a continuing need for a microwave fabrication process which enables passive components to be fabricated with highly repeatable characteristics and which enables pre-testing of active devices and/or the removal and replacement of faulty components without impairing any good components when a system fails to meet specifications.

A high density interconnect (HDI) structure or system which has been developed by General Electric Company offers many advantages in the compact assembly of digital and other electronic systems. For example, an electronic system such as a microcomputer which incorporates between 30 and 50 chips can be fully assembled and interconnected on a single substrate which is 2 inches long by 2 inches wide by 0.050 inch thick. The maximum operating frequency of such systems is normally, at present, less than about 50 MHz. Even more important than the compactness of this high density interconnect structure is the fact that it can be disassembled for repair or replacement of a faulty component and then reassembled without significant risk to the good components incorporated within the system. This reworkability or repairability is a substantial advance over prior connection systems in which reworking the system to replace damaged components was either impossible or involved substantial risk to the good components.

Briefly, in this high density interconnect structure, a ceramic substrate such as alumina which may be 25–100 mils thick and of appropriate size and strength for the overall system, is provided. This size is typically less than 2 inches square. Once the position of the various chips has been specified, individual cavities or one large cavity having appropriate depths at the intended locations of the various chips are prepared. This may be done by starting with a bare substrate having a uniform thickness and the desired size. Conventional, laser or ultrasonic milling may be used to form the cavities in which the various chips and other components will be positioned. For many systems where it is desired to place chips edge-to-edge, a single large cavity is satisfactory. That large cavity may typically have a uniform depth where the semiconductor chips have a substantially uniform thickness. Where a particularly thick or a particularly thin component will be placed, the cavity bottom must be made respectively deeper or shallower to place the upper surface of that component in substantially the same plane as the upper surface of the rest of the components and the surface of the portion of the substrate which surrounds the cavity. The bottom of the cavity is then provided with a thermoplastic adhesive layer which may preferably be polyetherimide resin available under the trade name ULTEM ® from the General Electric Company. The various components are then placed in their desired locations within the cavity, the entire structure is heated to the softening point of the ULTEM ® polyetherimide (in the vicinity of 217° C. to 235° C. depending on the formulation used) and then cooled to thermoplastically bond the individual components to the substrate. At this stage, the upper surfaces of all components and the substrate are disposed in substantially a common plane. Thereafter, a polyimide film which may be Kapton ® polyimide, available from E.I. du Pont de Nemours Company, which is about 0.0005–0.003 inch (12.5–75 microns) thick is pretreated to promote adhesion and coated on one side with an ULTEM ® polyetherimide resin or another thermoplastic and laminated across the top of the chips, other components and the substrate with the ULTEM ® resin serving as a thermoplastic adhesive to hold the Kapton ® in place. Thereafter, via holes are laser drilled in the Kapton ® and ULTEM ® layers in alignment with the contact pads on the electronic components to which it is desired to make contact. A metallization layer which is deposited over the Kapton ® layer extends into the via holes and makes electrical contact to the contact pads disposed thereunder. This metallization layer may be patterned to form individual conductors during the process of depositing it or may be deposited as a continuous layer and then patterned using photoresist and etching. The photoresist is preferably exposed using a which is scanned relative to the substrate laser to provide an accurately aligned conductor pattern at the end of the process.

Additional dielectric and metallization layers are provided as required in order to provide all of the desired electrical connections among the chips. Any misposition of the individual electronic components and their contact pads is compensated for by an adaptive laser lithography system which is the subject of some of the U.S. Patents and Patent Applications which are listed hereinafter.

This high density interconnect structure, methods of fabricating it and tools for fabricating it are disclosed in U.S. Pat. Nos. 4,783,695, entitled "Multichip Integrated Circuit Packaging Configuration and Method" by C. W. Eichelberger, et al.; 4,835,704, entitled "Adaptive Lithography System to Provide High Density Interconnect" by C. W. Eichelberger, et al.; 4,714,516, entitled "Method to Produce Via Holes in Polymer Dielectrics for Multiple Electronic Circuit Chip Packaging" by C. W. Eichelberger, et al.; 4,780,177, entitled "Excimer Laser Patterning of a Novel Resist" by R. J. Wojnarowski et al.; U.S. patent application Ser. No. 249,927, now abandoned filed Sep. 27, 1989, entitled "Method and Apparatus for Removing Components Bonded to a Substrate" by R. J. Wojnarowski, et al.; U.S. Pat. No. 4,894,115 issued Jan. 16, 1990, entitled "Laser Beam Scanning Method for Forming Via Holes in Polymer Materials" by C. W. Eichelberger, et al.; U.S. patent application Ser. No. 312,798, now abandoned filed Feb. 21, 1989, entitled "High Density Interconnect Thermoplastic Die Attach Material and Solvent Die Attachment Processing" by R. J. Wojnarowski, et al.; U.S. Pat. No. 4,878,991 issued Nov. 7, 1989, entitled "Simplified Method for Repair of High Density Interconnect Circuits" by C. W. Eichelberger, et al.; U.S. patent application Ser. No. 305,314, now abandoned filed Feb. 3, 1989, entitled "Fabrication Process and Integrated Circuit Test Structure" by H. S. Cole, et al.; in favor of continuation application Ser. No. 07/559,532, filed Jul. 19, 1990. U.S. Pat. Nos. 5,019,946, filed Sep. 27, 1988, entitled "High Density Interconnect With High Volumetric Efficiency" by C. W. Eichelberger, et al.; 5,019,535, filed March 28, 1989, entitled "Die Attachment Method for Use in High Density Interconnected Assemblies" by R. J. Wojnarowski, et al.; 4,960,613 issued Oct. 2, 1990, entitled "Laser Interconnect Process" by H. S. Cole, et al.; 4,884,122 issued Nov. 28, 1990 entitled "Method and Configuration for Testing Electronic Circuits and Integrated Circuit Chips Using a Removable Overlay Layer" by C. W. Eichelberger, et al.; U.S. patent application Ser. No. 233,965, now abandoned filed Aug. 8, 1988, entitled "Direct Deposition of Metal Patterns for Use in Integrated Circuit Devices" by Y. S. Liu, et al., and now abandoned; U.S. Pat. Ser. No. 4,882,200 issued Nov. 21, 1989 entitled "Method for Photopatterning Metallization Via UV Laser Ablation of the Activator" by Y. S. Liu, et al.; U.S. patent application Ser. No. 237,685, now abandoned filed Aug. 25, 1988, entitled "Direct Writing of Refractory Metal Lines for Use in Integrated Circuit Devices" by Y. S. Liu, et al., and now abandoned; U.S. Pat. Nos. 4,933,042 issued Jun. 12, 1990, entitled "Method and Apparatus for Packaging Integrated Circuit Chips Employing a Polymer Film Overlay Layer" by C. W. Eichelberger, et al.; 4,897,153 issued Jan. 30, 1990, entitled "Method of Processing Siloxane-Polyimides for Electronic Packaging Applications" by H. S. Cole, et al.; U.S. patent application No. 4,988,412 issued Jan. 29, 1991, entitled "Selective Electrolytic Deposition on Conductive and Non-Conductive Substrates" by Y. S. Liu, et al.; U.S. patent application Ser. No. 312,536, now abandoned filed Feb. 17, 1989, entitled "Method of Bonding a Thermoset Film to a Thermoplastic Material to Form a Bondable Laminate" by R. J. Wojnarowski and now abandoned; U.S. patent application Ser. No. 363,646, now abandoned filed Jun. 8, 1989, entitled "Integrated Circuit Packaging Configuration for Rapid Customized Design and Unique Test Capability" by C. W. Eichelberger, et al.; U.S. Pat. Nos. 5,127,998, filed Jan. 2, 1990, entitled "Area-Selective Metallization Process" by H. S. Cole, et al.; 5,258,920, filed Dec.26, 1989, entitled "Locally Orientation Specific Routing System" by T. R. Haller, et al.; No. 5,169,678, filed Dec. 26, 1989, entitled "Laser Ablatable Polymer Dielectrics and Methods" by H. S. Cole, et al.; U.S. patent application Ser. No. 454,546, now abandoned filed Dec.21, 1989, entitled "Hermetic High Density Interconnected Electronic System" by W. P. Kornrumpf, et al.; U.S. Pat. No. 5,040,047, filed Dec. 26, 1989, entitled "Enhanced Fluorescence Polymers and Interconnect Structures Using Them" by H. S. Cole, et al.; and U.S. patent application Ser. No. 454,545, now abandoned filed Dec. 21, 1989, entitled "An Epoxy/Polyimide Copolymer Blend Dielectric and Layered Circuits Incorporating It" by C. W. Eichelberger, et al., abandoned in favor of divisional application Ser. No. 07/646,112, filed Jan. 28, 1991. Each of these Patents and Patent Applications is incorporated herein by reference.

This high density interconnect system has been developed for use in interconnecting semiconductor chips to form digital systems. That is, for the connection of systems whose operating frequencies are typically less than about 50 MHz, which is low enough that transmission line and other wave impedance matching effects have not needed to be considered.

The interconnection of microwave structures presents many problems, considerations and challenges not faced in the interconnection of digital systems. Use of microwave frequencies requires consideration of wave characteristics, transmission line effects, material properties at microwave frequencies, the presence of exposed delicate structures on MMICs and other components and system and component characteristics which do not exist at the lower operating frequencies of such digital systems. These considerations include the question of whether the dielectric materials are suitable for use at microwave frequencies, since materials which are good dielectrics at lower frequencies can be quite lossy or even conductive at microwave frequencies. Further, even if the dielectric is not lossy at microwave frequencies, its dielectric constant itself may be high enough to unacceptably modify the operating characteristics of MMICs, GaAs transistors and other microwave components or structures which might be interconnected using a high density interconnect structure. Since the first dielectric layer of this high density interconnect structure is applied by a lamination process involving the application of substantial pressure to the polyimide film, there is a substantial concern that air bridges and other delicate structures in microwave components may be damaged, destroyed or modified either by the lamination pressure causing them to collapse or by the infiltration of the thermoplastic adhesive into the air gap under the conductor, thereby modifying the dielectric properties of that gap, or even the mere presence of the dielectric unacceptably modifying the operating characteristics of some of the components.

Because of the low yield of finally assembled microwave systems, such systems are quite expensive both because of ultimate component cost and because the fabrication process is more akin to engineering than to semiconductor fabrication techniques. In order to increase the yield of final systems and to reduce their cost to the point where they become feasible for use in everyday systems, there is a need for a technique for packaging individual microwave components and subsystems in an efficient, high yield manner which enables such components and subsystems to be assembled into final systems with a high yield.

The related application Ser. No. 07/504,821 now abandoned entitled, "High Density Interconnected Microwave Circuit Assembly" overcomes the problems of reworkability and poor passive component tolerances of the prior art thin and thick film microwave system assembly methods whereby if a microwave system, when assembled does not meet specifications, it can be disassembled for removal of faulty components and reassembled without danger to good components.

Related U.S. Pat. No. 5,206,712, entitled, "A Building Block Approach to Microwave Modules" provides a solution to the problem of packaging microwave components in an efficient, reliable, high yield manner which makes the assembly of a microwave system from prepackaged components attractive and desirable, both from an efficiency and yield point of view.

Related application Ser. No. 07/504,803, entitled, "Microwave Component Test Method and Apparatus" provides a solution to the problem of testing microwave components in an efficient, high correlation manner without significant risk to the components.

Together, these three related applications solve many of the problems which have plagued the microwave packaging and assembly arts. However, several problems in the microwave art are not directly addressed by those applications. In particular, the microwave art suffers from the problem that there are many microwave components which include structures which must be a specified portion of a wavelength long in order to operate in their intended manner. These components include combiners, dividers, couplers, impedance transformers and so forth. These fixed length structures often must be one quarter wavelength ($\lambda/4$) or one half wavelength ($\lambda/2$) long. Consequently, microwave systems including such components tend to be undesirably large. This size problem is not directly addressed by the above related applications, except to the extent that a transmission line may be fabricated using a high dielectric constant dielectric layer which has the effect of shortening the wavelength within that transmission line and thereby shortening the physical length of a segment of transmission line having a given electrical length. However, since the dielectric layers of the high density interconnect structure must meet tight specifications on many physical properties such as melting or softening temperature, thermal stability, radiation hardness, dimensional stability, laser drillability and so forth, the selection or development of another dielectric material for use in such structures is not a simple or straight forward process.

A further problem in the microwave art is the problem of feedback in high gain systems. In particular, in systems having a gain in excess of about 50 to 60 dB oscillation normally develops as a result of feedback from the output to the input, unless special precautions are taken. Such problems are normally addressed in the microwave art by a combination of forming the microwave system in a long, linearly arranged manner which spaces the output a maximum distance from the input to thereby minimize feedback and cross-talk between the output and the input and by the inclusion of shielding structures designed to prevent feedback from the output to the input. Background application Ser. No. 07/454,546, now abandoned entitled, "Hermetic High Density Interconnected Electronic Systems" can be adapted to provide shielding between an output or high power portion of a microwave system and an input or low power portion of a microwave system which is fabricated in accordance with the related application Ser. No. 07/504,821 now abandoned entitled, "High Density Interconnected Microwave Circuit Assembly" and U.S. Pat. No. 5,206,712, entitled, "A Building Block Approach to Microwave Modules".

Many systems incorporating microwave subsystems have conflicting system requirements in that they (1) require high gain microwave subsystems, which by their nature, have a sizeable length and (2) require that the systems be packaged in a compact structure. One technique which has been used in an attempt to reconcile these conflicting requirements is to assemble a microwave system from separate modules or subsystems by stacking them vertically in an input to output sequence and connecting the modules with wires and cables which extend vertically from the output of one module to the input of another. This spaces the output or high power portion of the system an acceptably long electrical distance from the input or low power level portion of the system, while at the same time, providing a physically compact structure. Unfortunately, such systems are normally subject to failure, leakage, impedance mismatching and so forth in the interlayer connection structures.

Related application Ser. No. 07/504,769 now abandoned entitled, "A Flexible High Density Interconnect Structure and Flexibly Interconnected System", discloses a technique for rendering a portion of a high density interconnection structure flexible.

There is a continuing need for a microwave system fabrication and assembly technique and final system structure which will enable microwave systems to be packaged in a physically compact manner while preventing output-to-input feedback and cross-talk without sacrificing system reliability and operating characteristics.

OBJECTS OF THE INVENTION

Accordingly, a primary object of the present invention is to provide an improved microwave system configuration which is physically compact while providing high reliability and high output-to-input isolation.

Another object of the present invention is to provide a compact system structure which takes advantage of the packaging and testing advances of the related applications.

Another object of the present invention is to provide a multi-module microwave system in which intra- and inter-module connections are fabricated in the same manner.

Still another object of the present invention is to provide a multi-module microwave system in which intra- and inter-module connected are fabricated at the same time.

A further object of the present invention is to provide a multi-module microwave system in which intra- and inter-module connected are included in a common structure.

SUMMARY OF THE INVENTION

The above and other objects which will become apparent from the specification as a whole, including the drawings, are achieved in accordance with the present invention by partitioning a microwave system into separate modules which are then assembled on separate high density interconnect substrates which are physically spaced apart but electrically interconnected by a common high density interconnect structure. The portion of the high density interconnect structure between adjacent modules is then rendered flexible and the structure is folded back on itself in these flexible portions of the interconnect structure to place the individual modules in a stack while retaining their sequential electrical connection. The physical stacking of the modules aids in output-to-input isolation. Where even more isolation is desired, the high density interconnect structure may include an outer, "hermetic" conductive shielding layer thereon.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
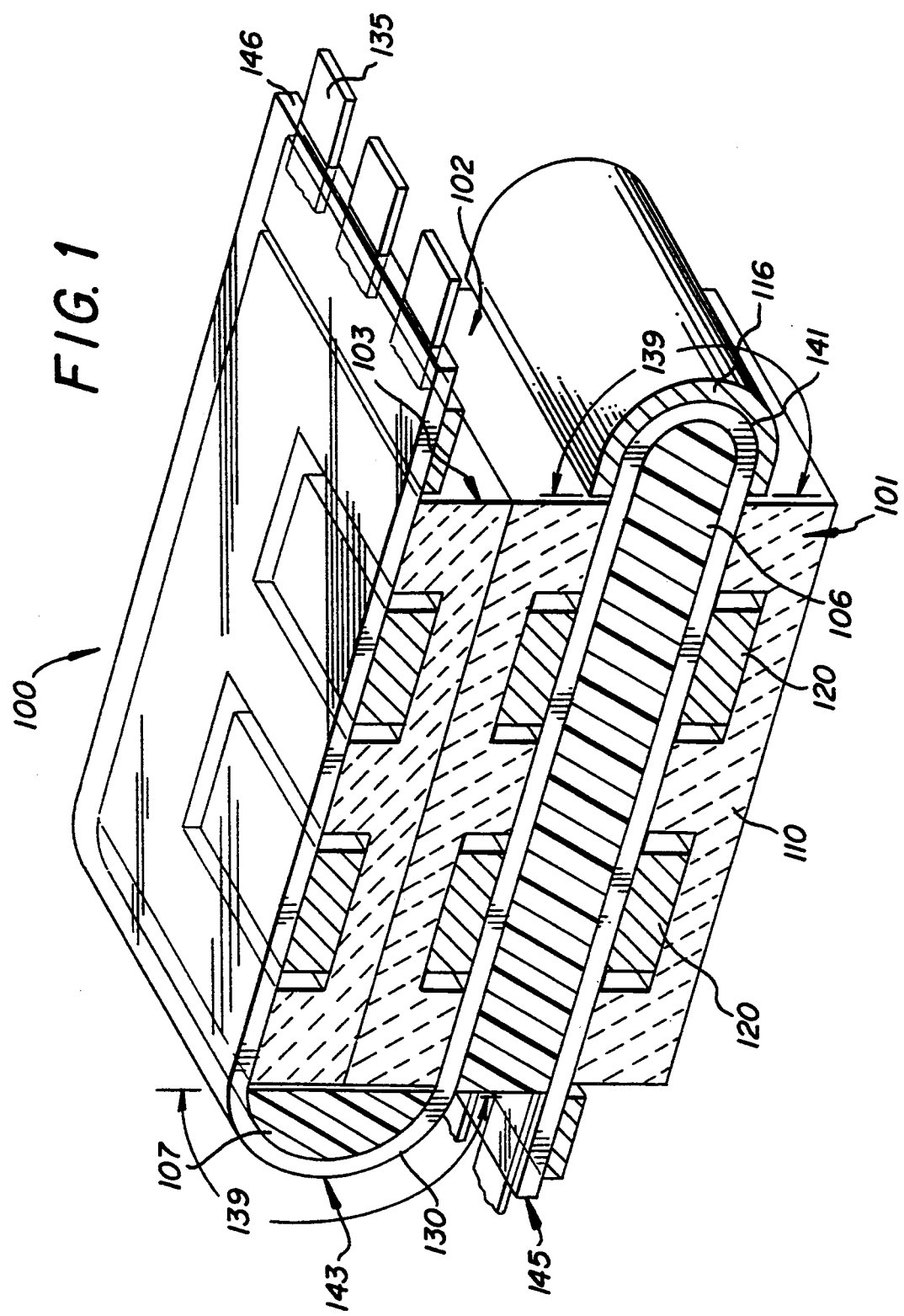
FIG. 1 illustrates a three module microwave system assembled in accordance with the present invention.

In FIG. 1, a microwave system 100 in accordance with the present invention is illustrated in a 3-D view. The system 100 comprises first, second and third modules 101, 102 and 103, respectively, which are disposed in a physical stack having three tiers. Each of the modules comprises a substrate 110 and a plurality of semiconductor chips, microwave devices, monolithic microwave integrated circuits and other components 120 as is appropriate to the module function. These devices, components and integrated circuits may all be referred to as chips. Each of the chips 120 is secured to the substrate by an appropriate bonding layer (not shown). Normally, this bonding layer is a thermoplastic adhesive in accordance with the teachings of the background high density interconnect structure patents and applications cited above, but other bonding materials such as solder, thermoset polymer adhesives and so forth may be used. The three modules 101, 102 and 103 form a stacked, serpentine structure and are electrically interconnected by a high density interconnect structure 130 which includes appropriate microwave transmission structures in accordance with the teachings of related U.S. Pat. No. 5,206,712, entitled, "A Building Block Approach to Microwave Modules" and application Ser. No. 07/504,821, now abandoned entitled, "High Density Interconnected Microwave Circuit Assembly", and such other conductors as are appropriate to the overall system. Adjacent tiers in the stack are connected by bent or folded portions 139 or the flexible high density interconnect structure. The portions 139 of the high density interconnect structure 130 which are laterally displaced from the stack of modules 101–103 are rendered flexible in accordance with the teachings of related application Ser. No. 07/504,769 now abandoned, entitled, "A Flexible High Density Interconnect Structure and Flexibly Interconnected System". The structure is preferably originally fabricated with the interconnect structure 130 disposed in a planar configuration. It is subsequently folded or bent to place the modules in the relative positions illustrated in FIG. 1. This bending is preferably done on mandrels or other support structures such as 106 or 107, to control the radius of curvature of the bends and prevent creasing of the conductors. While it is considered preferable to have the flexible high density interconnect structure have a constant radius of curvature at each bend, it will be understood that this is not necessary. The intermodule support 106, which is disposed between modules 101 and 102, is provided for the purpose of preventing the lower or right-hand bend 141 in the interconnect structure 130 from being collapsed and creased due to the weight of modules 102 and 103 or due to careless handling. The flexible portion 139 of the interconnect structure 130 in the vicinity of the bend 141 is provided with extra support in the form of a support member 116 which supports the conductors of high density interconnect structure 130 in compression in the bend 141 as taught in related application Ser. No. 07/504,769 now abandoned, entitled, "A Flexible High Density Interconnect Structure and Flexibly Interconnected System". This is because the flexible high density interconnect structure is disposed on the inside of the bend and conversely, the support member is disposed on the outside of the bend. That is, the flexible high density interconnect structure has a smaller radius of curvature than the support member 116. The left-hand or upper bend 143 is held open by the relative positioning of the substrates of modules 102 and 103 but is preferably provided with a mandrel or support 107 to minimize the risk of handling damage.

The back surfaces of the substrates of the modules 102 and 103 are disposed in direct contact and may be bonded to each other by an appropriate adhesive or solder in accordance with the construction of the substrates and as may be considered desirable in the particular system. At the ends 145 (lower left) and 146 (upper right) of the interconnect structure 130, the interconnection system 130 is provided with I/O connection tabs 135 in accordance with the teachings of related application Ser. No. 07/504,769 now abandoned, entitled, "A Flexible High Density Interconnect Structure and Flexibly Interconnected System". These I/O connection tabs 135 may be connected to the remainder of the system (not shown) by soldering, insertion in appropriate sockets or such other means as may be considered appropriate. These I/O connection tabs may preferably be durable foil or sheet members, or portions of the high density interconnect structure conductors which have been exposed by removal of the high density interconnect dielectric, both in accordance with the teaching of application Ser. No. 07/504,769 now abandoned and may include parallel plate (microstrip or stripline) transmission lines as may be appropriate to the signals they are intended to carry.

The modules 101, 102 and 103 may be connected in electrical series as in a cascade of amplifying stages which operate at progressively higher power levels and in which it is desired to provide maximum isolation between the highest power stage and the lowest power stage. Alternatively, the modules may be connected in parallel as in a set of amplifiers which are connected in parallel so that they are driven by a common input and so that their outputs are combined to drive a common load. In this situation, an input signal line may be disposed along one edge of the high density interconnect structure and an output or high power signal line may be disposed along the other edge of the high density interconnect structure. This provides a compact stack of modules which has a desirably small footprint. As a further alternative, the modules may be interconnected in a manner which is a combination of series and parallel or in a manner in which signals are cross-connected among the modules in a pattern which is neither series nor parallel.

Figure 2:
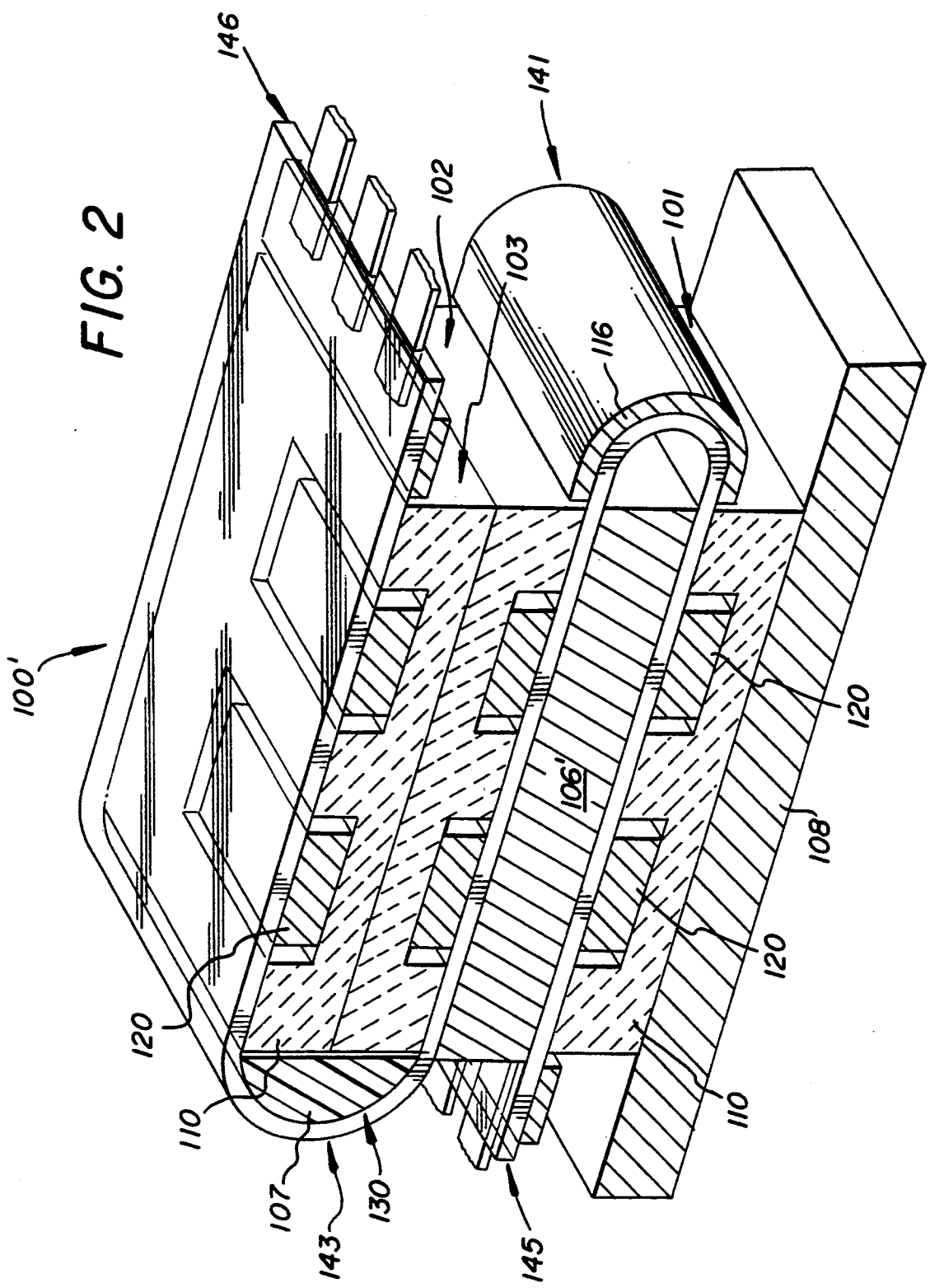
FIG. 2 illustrates a modified version of the FIG. 1 structure incorporating a heat sink and heat spreader to aid in the dissipation of heat generated in a high power stage.
Figure 3:
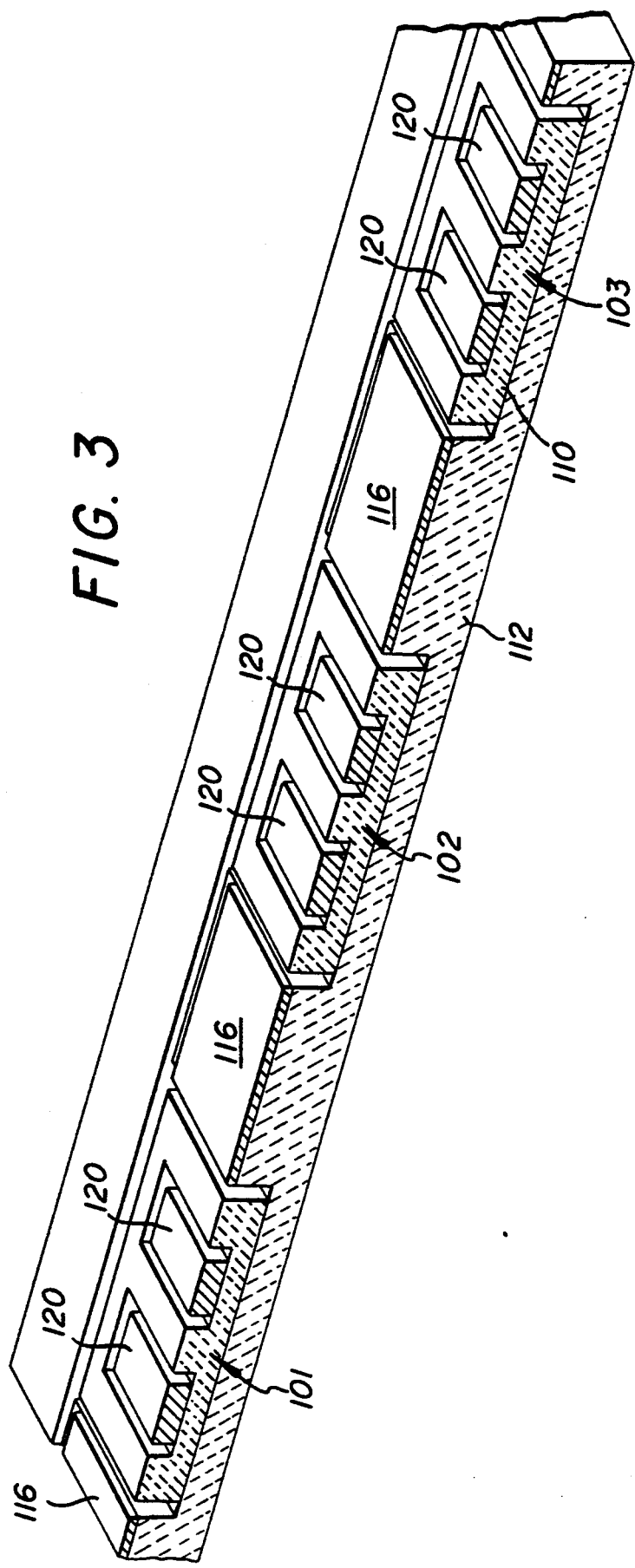
FIGS. 3–7 illustrate a process for fabricating the high density interconnect structure of the FIGS. 1 and 2 systems.
Figure 4:
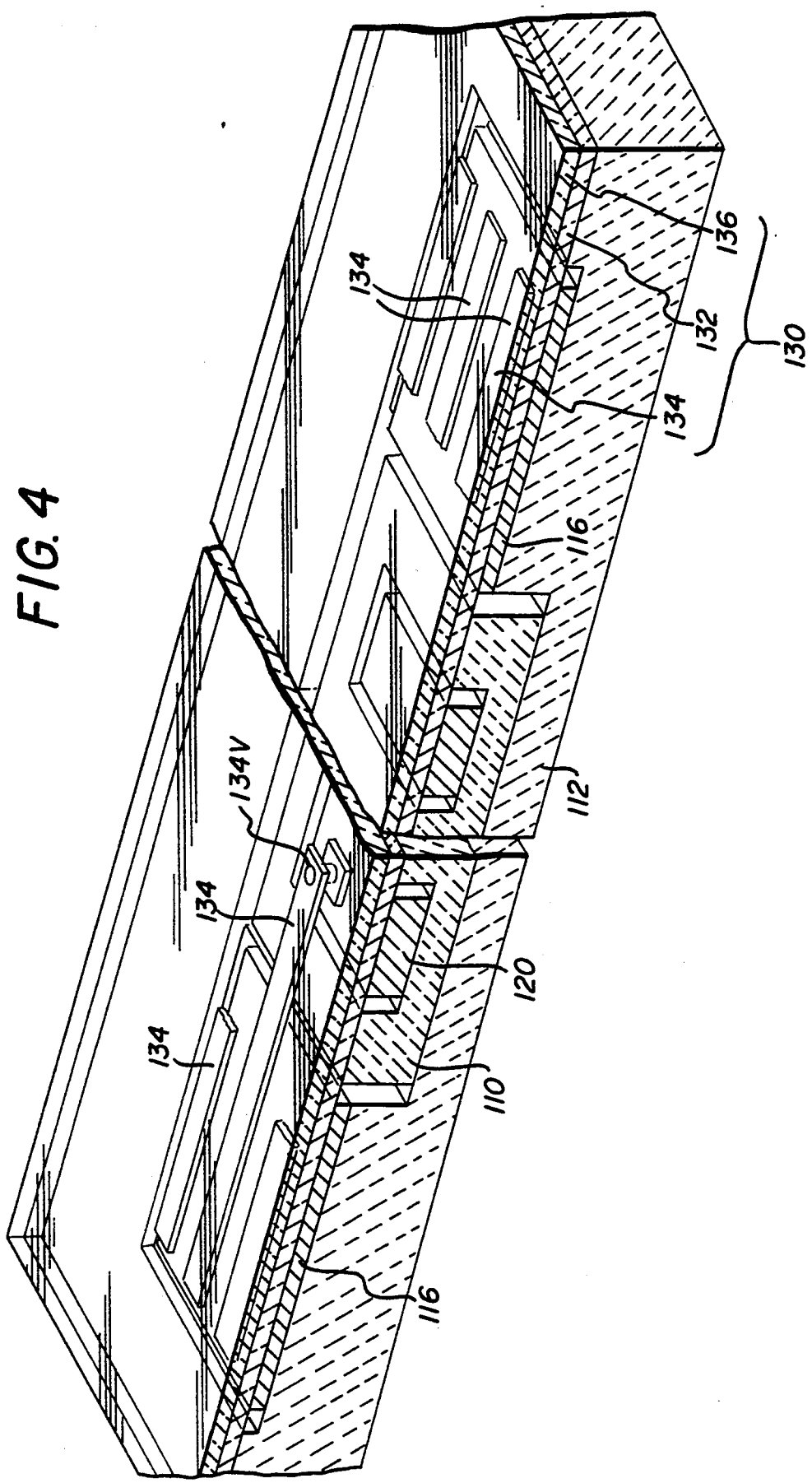
Figure 5:
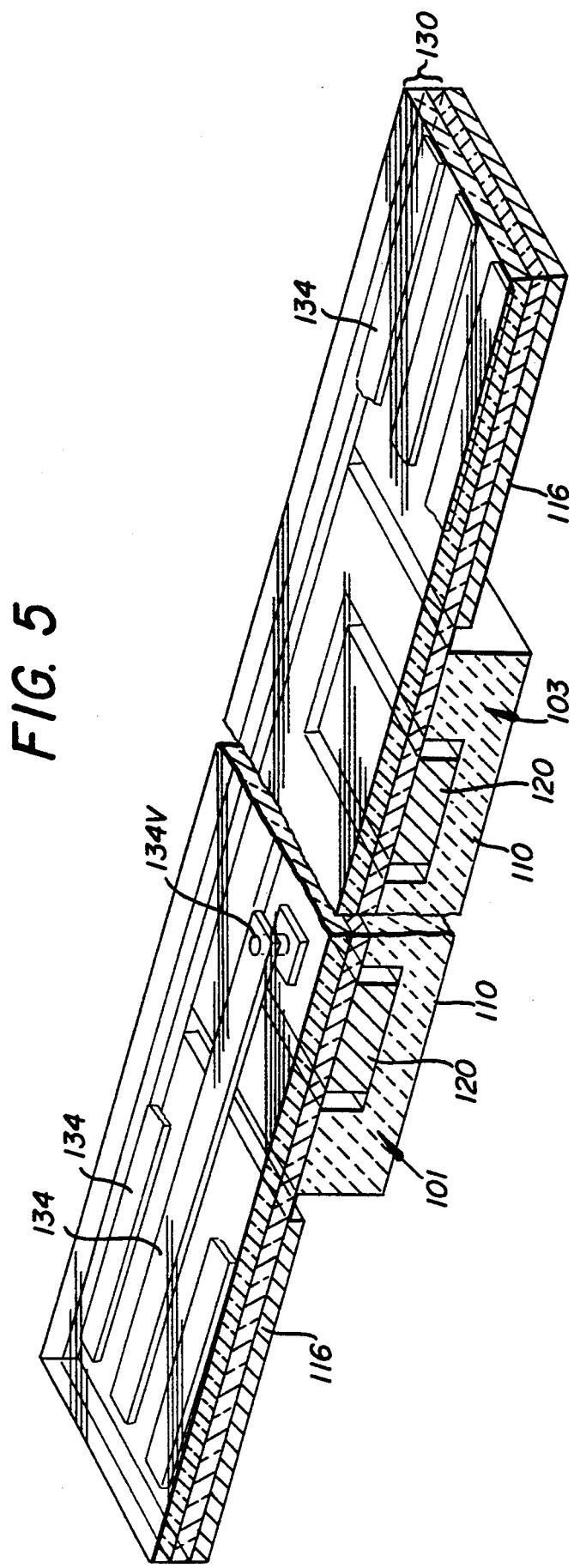
Figure 6:
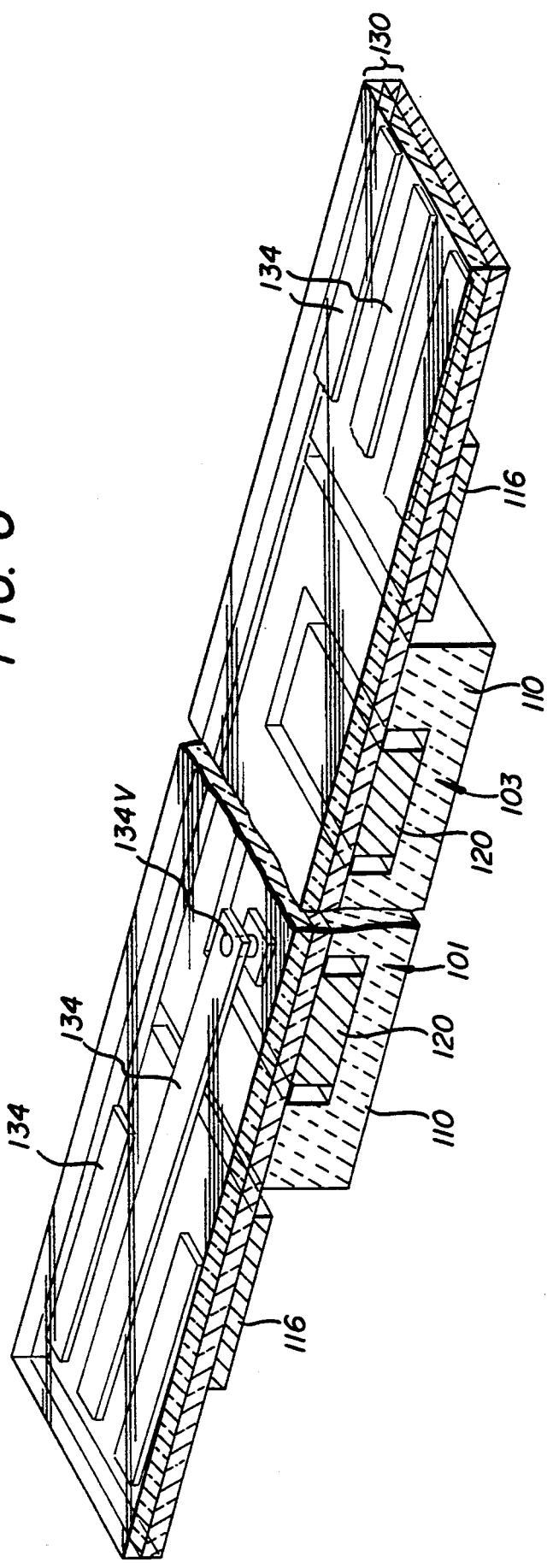

The system 100 is illustrated assembled in an alternative manner 100' in FIG. 2. Throughout this specification a reference numeral which is changed by adding a prime ('), a double prime (") or an asterisk (*) identifies similar structure which has been modified, but which serves the same or a similar function. Where unmodified elements are not specifically discussed in connection with a particular figure or embodiment, the reader is referred to an earlier discussion of that element for a discussion of its purpose of function. The FIG. 2 assembly is like the FIG. 1 assembly, with the exceptions that (1) the spacer 106' in FIG. 2 is made of a high thermal conductivity material to serve as a heat spreader and lacks the round end adjacent bend 141 and (2) the back surface of the substrate 110 of module 101 is disposed in direct contact with, and preferably bonded to, a heat sink 108. A heat spreader is generally a high thermal conductivity member though which heat from the adjacent body spreads out rapidly and is then transferred to a further heat conductor over a larger area than the body for which it spreads heat. This maximizes the heat transfer rate for the attached body. It will be recognized that a heat sink is a special case of a heat spreader in that it not only spreads heat, but is also designed to rapidly dissipate heat into the adjacent atmosphere by conduction and radiation or by fluid cooling.

Figure 7:
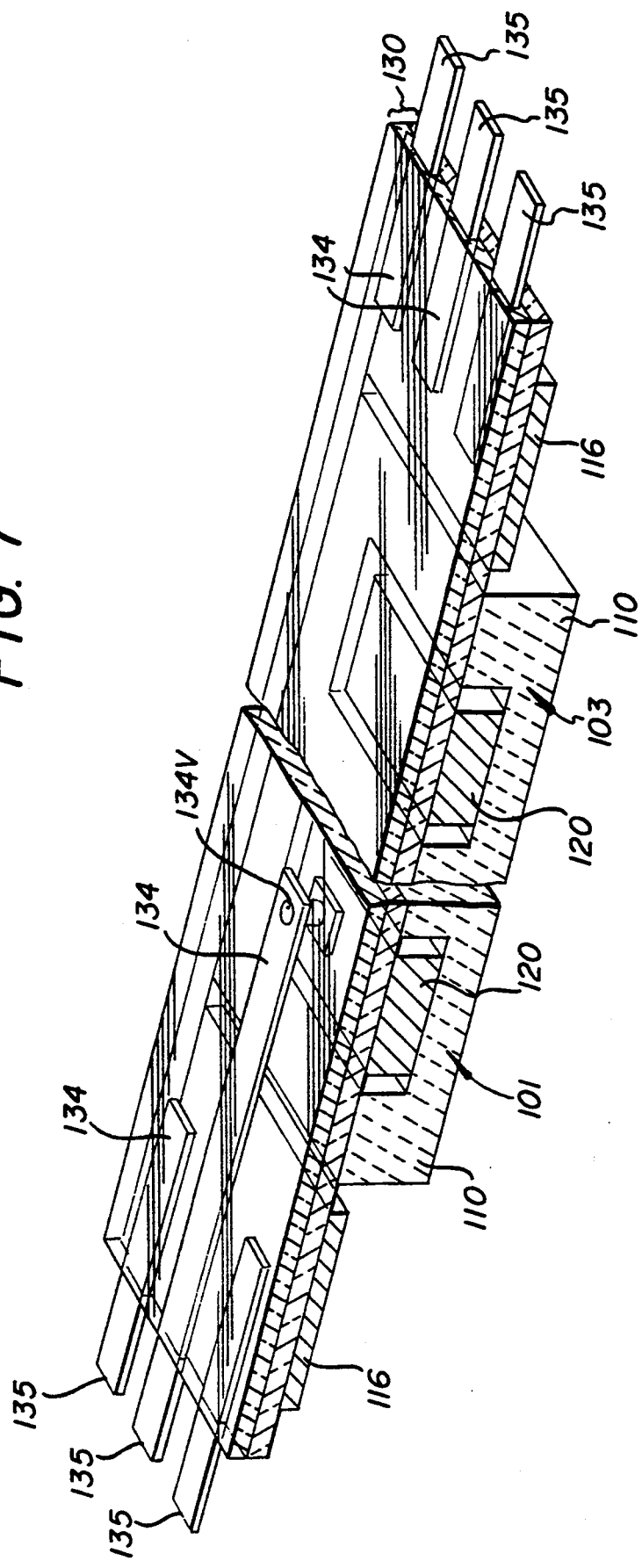

This high density interconnect structure may be fabricated in accordance with the method which is described briefly in the Background Information section of this specification and in the High Density Interconnect U.S. Patents and Patent Applications cited therein. That fabrication process is modified in the manner taught in the above-identified related patent application Ser. No. 07/504,769 now abandoned in which selected portions of the final high density interconnect structure are rendered flexible by separating them from the support structure on which they were disposed during the fabrication process. This process is illustrated in FIGS. 3-7. Briefly, the process involves placing the substrates 110 of the modules 101-103 and the support members 116 in a carrier 112 (FIG. 3), forming the high density interconnect structure 130 comprised of dielectric layer 132 and 136 and conductors 134 thereon (FIG. 4), removing the completed high density interconnected system from the carrier (FIG. 5), trimming (selectively removing) the support members 116 as desired (FIG. 6) and selectively removing the dielectric layers 132 and 136 to expose the connection tabs 135, as desired (FIG. 7). In FIGS. 4-7, the central portion of the system has been omitted from the figures by breaking them in order to show more detail at the ends of the system which is where the connection tabs are disposed. However, one of the conductors 134 is shown extending over one of the chips 120 to indicate that some or all of the conductors 134 connect to the chips through via holes in the dielectric where a portion 134V of the conductors extends down into the via hole and into ohmic contact with a contact pad of the chips. The rest of the conductors 134 are omitted from the central portion of the structure for drawing clarity.

This interconnection structure includes unique features when it is fabricated by first bonding the dielectric layer to the underlying structure, then forming the via holes in the dielectric by laser "drilling" from above and then depositing the metal of the conductors 134 over the dielectric and in the via holes where the portion 134V makes ohmic contact to the underlying contact pad or other metalization. In particular, the external configuration of the metal in the via hole takes on the shape of the via hole, rather than vice versa as would be the case if the metal were formed first (as by wire bonding or other processes) and the dielectric filled in around it. The nature of the laser drilling process, which is used to form the via holes by drilling from the top, typically results in a via hole which is wider at the top than at the bottom. This via hole shape provides improved metal continuity between the portion of a conductor which is disposed at the bottom of a via hole and the portion which is outside the via hole. This is because the via hole wall surface on which the metal is deposited has a sloping-upward-and-outward configuration which is known from the semiconductor arts to result in a deposited metalization layer achieving better step coverage than is achieved where the step has a vertical wall surface. The term step coverage refers to the uniformity of the metal coverage where the deposition surface changes levels from one planar surface area (the bottom of the via hole) to another planar surface area (the top of the dielectric layer). When the conductors are formed in accordance with the preferred manner described in the background Patents and Patent Applications, the upper surface of the metal conductor typically has a depression or dimple in it at the via hole because the metal of the conductors is deposited to a substantially uniform thickness everywhere, including in the via holes (which are not filled prior to deposition of the metal across the planar surface of the dielectric layer). Consequently, the surface topology of the metalization is similar to the surface topology of the layer on which it is deposited.

It will be understood, that the provision of connection tabs 135 is unnecessary for use in any system which is adapted to the use of another type of connection. In that case, a suitable connector is included in the structure being connected by the high density interconnect structure or is fabricated as part of the high density interconnect structure.

Figure 8:
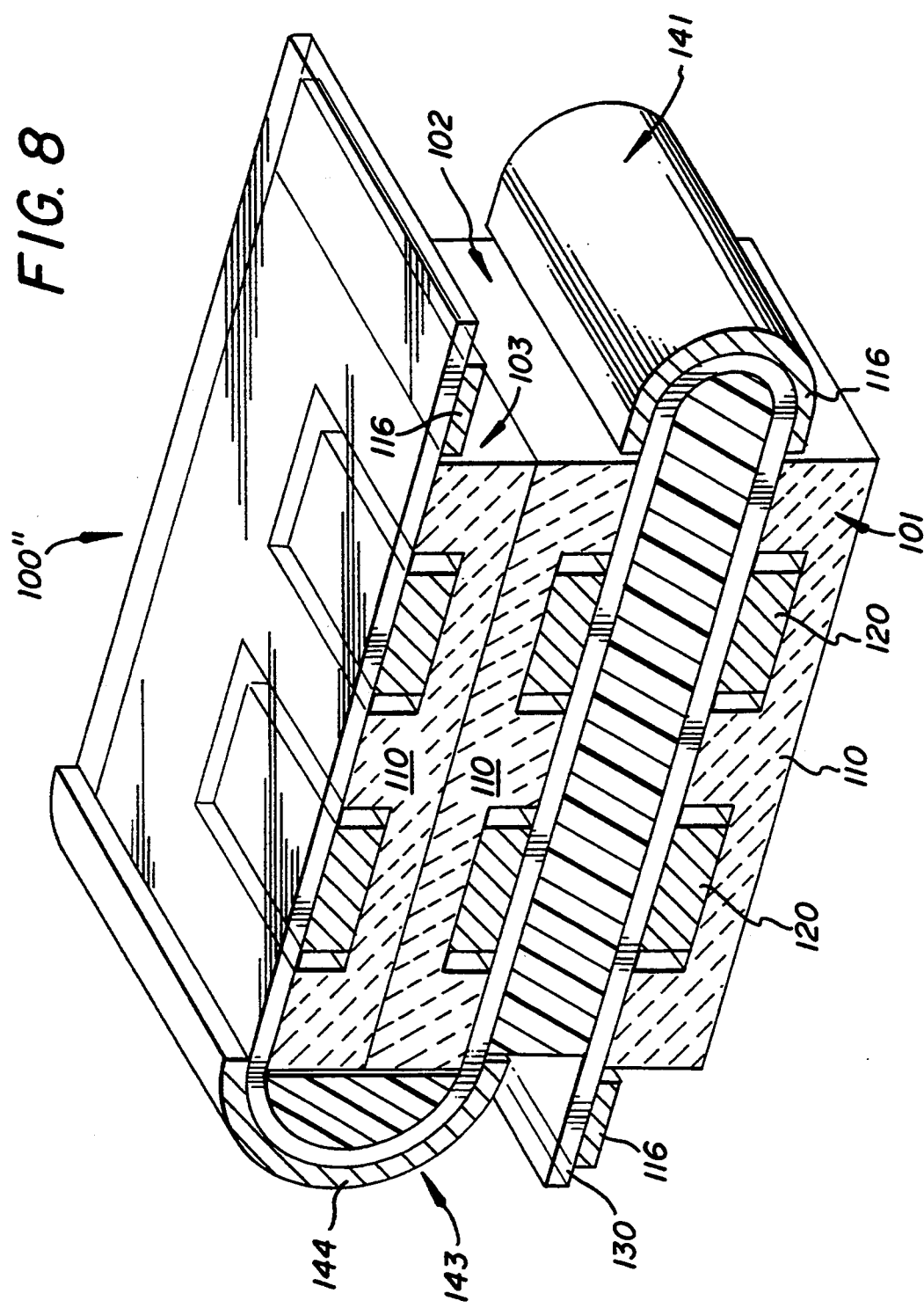
FIG. 8 illustrates a modified version of the FIG. 1 structure which increases the structural integrity and reliability of the overall system.

A modified version 100" of the system 100 of FIG. 1 is illustrated in FIG. 8. This modified system 100" differs from the FIG. 1 system 100 by the addition of a further support member 144 to provide support for the flexible portion of the interconnect structure in the vicinity of bend 143. The system 100" is otherwise like the system 100 illustrated in FIG. 1. It will be recognized that this same additional support member may be provided in the FIG. 2 configuration 100" of the system. If a larger radius of curvature is desired for bend 143, an additional spacer may be inserted (in any of the embodiments) between the substrates of modules 102 and 103 to space their substrates 110 apart vertically in the figure.

In FIGS. 1–8, the support members 116 have been illustrated as being disposed physically adjacent to, but not overlapping or bonded to the substrates on which the modules are fabricated. For increased ruggedness, these support members may be bonded to those substrates by forming the support members to cover the entire plateau portion of the upper surface of the substrate while leaving apertures in alignment with the cavities for insertion of the chips. Alternatively, as shown in system 100* in FIG. 9, the support member may overlap only the end of the substrate. In that situation, the substrate is preferably provided with a step or shoulder 117* along each edge where a support member 116 is to be bonded to the substrate. The depth of this shoulder or step is selected to place the support member's upper surface in the same plane as the upper surfaces of the chips and the rest of the upper surface of the substrate. Depending on the composition of the interconnect support member, such bonding may be done using the direct bond copper process taught in U.S. Pat. Nos. 3,744,120, 3,854,892 and 3,911,553 to Burgess et al.; 3,766,634 and 3,993,411 to Babcock et al.; 3,994,430 and 4,129,243 to Cusano et al.; 4,409,278 to Jochym; and 4,563,383 to Kuneman et al. and 4,996,116 entitled "Enhanced Direct Bond Copper Process and Structure" by Harold F. Webster, et al., filed Dec. 21, 1989; and 5,241,216 entitled "Ceramic-to-Conducting-Lead Hermetic Seal" by Harold F. Webster, filed Dec. 21, 1989. Each of these patents and applications is incorporated herein by reference. If the direct bond copper process (1065° C.) or another high temperature process is used, then the support members 116 should be bonded to the substrates 110 before any chips are mounted thereon. Alternatively, this bonding may be done by soldering with high temperature solders, by bonding with low temperature adhesives or other attachment means as may be considered appropriate. Although not preferred, such attachment means may include fasteners which extend through the substrate to hold the interconnect structure in place. If the direct bond copper process is used, then the support members 116 should be bonded to the substrates 110 before the chips are mounted thereon.

An advantage of bonding the interconnect support members 116 to the substrates is that it avoids or prevents the risk or problem of a weak point in the system being situated where the interconnect structure bridges the gap between a substrate and the adjacent interconnect support member. That gap is a high stress location which increase the risk of fracturing the flexible high density interconnect structure at that location if further support is not provided. Bonding the support member to the substrate provides that further support, thereby increasing the ruggedness of the overall system.

Figure 9:
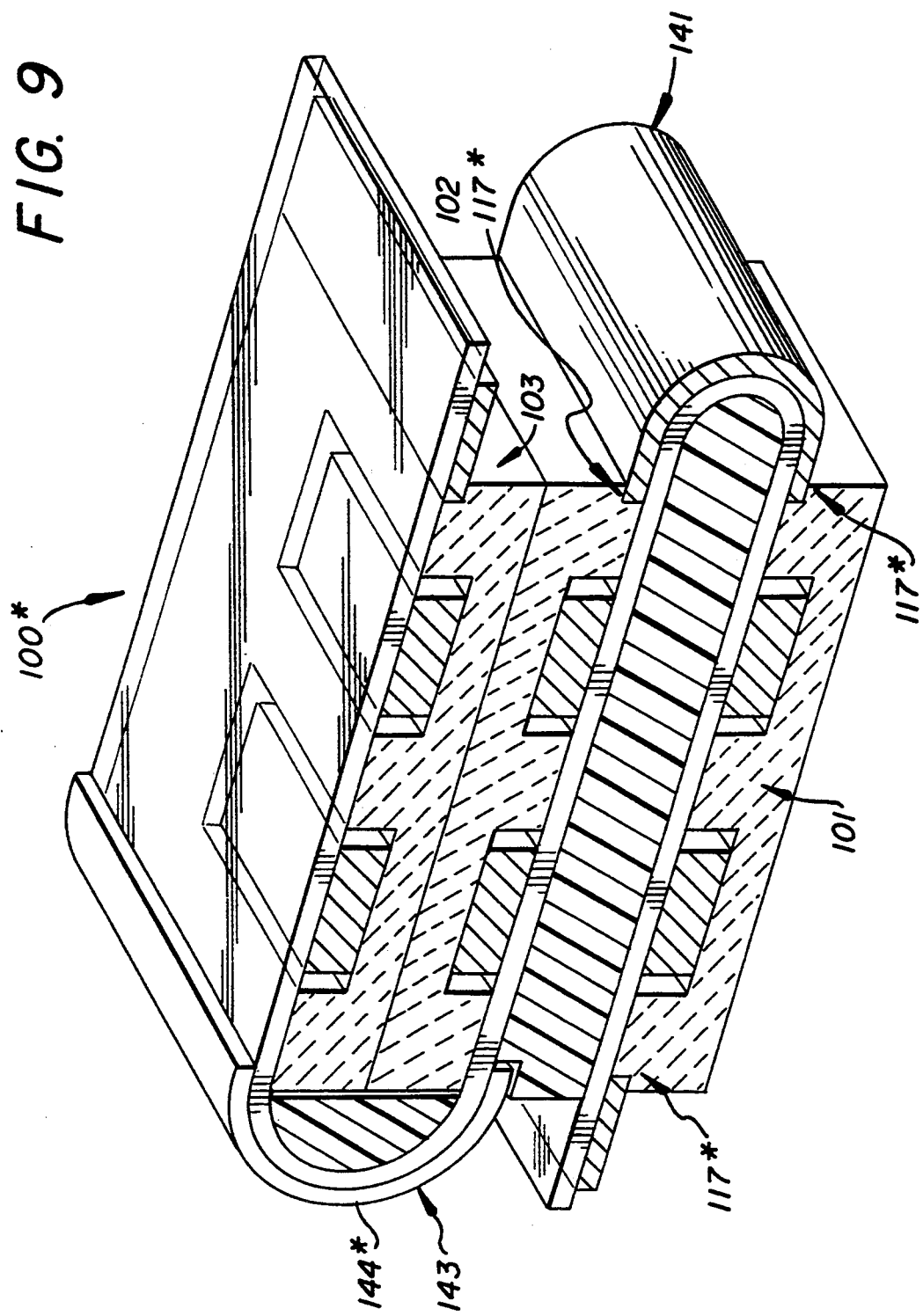
FIG. 9 illustrates a modified version of the FIG. 8 structure which further increases the structural integrity and reliability of the overall system.
Figure 10:
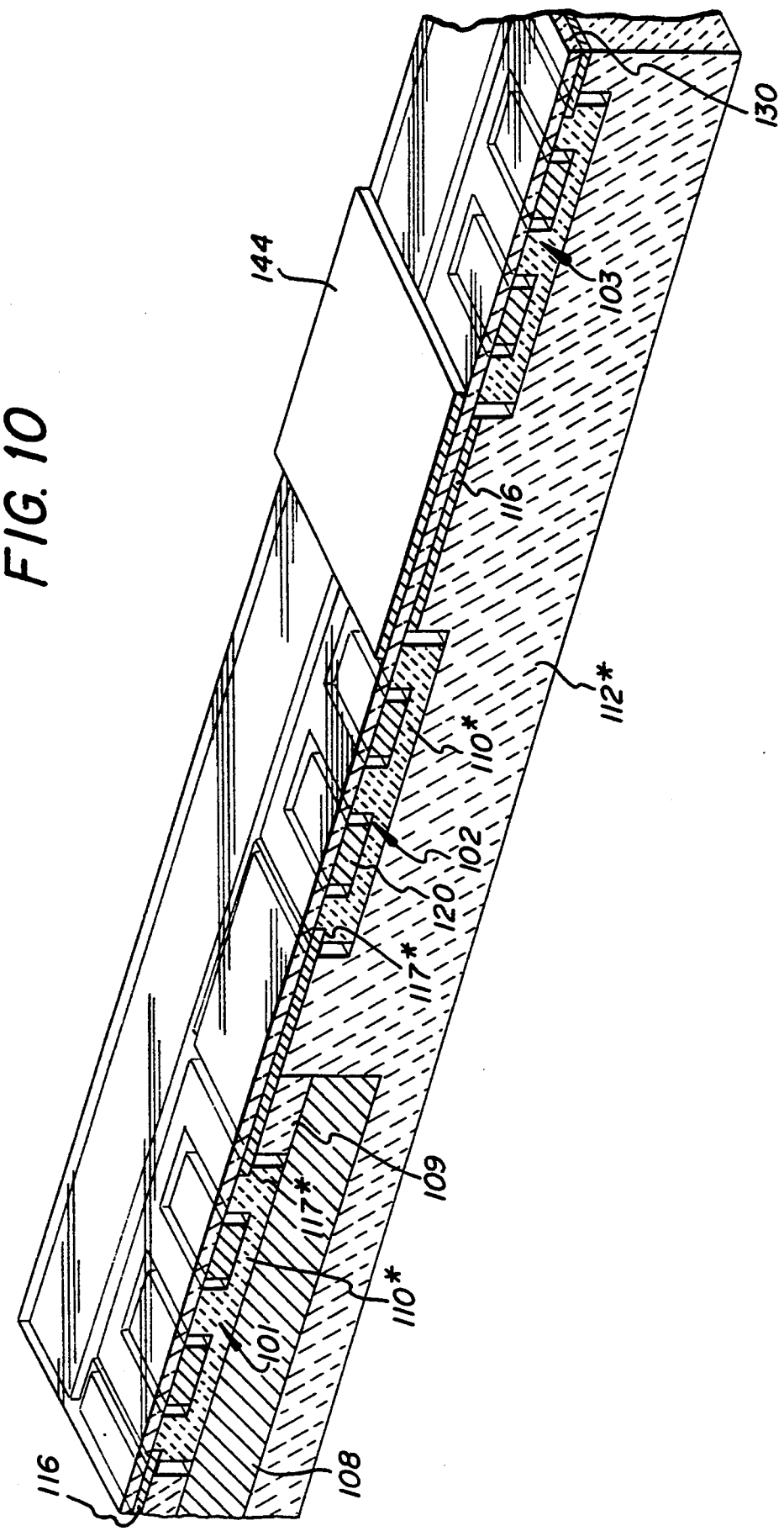
FIG. 10 illustrates an additional step in the fabrication process used to fabricate a system of the type illustrated in FIG. 9.

During the fabrication of system 100* of the type illustrated in FIG. 9, additional steps are added to the process of FIGS. 3–7 in that the support members 110 are bonded to the shoulders 117* prior to the insertion of the chips 120 and the bonding of the support member 144* to the high density interconnect structure is added as the final step of the high density interconnect structure fabrication sequence. As illustrated in FIG. 10, the support member 144 is bonded to the upper or exposed surface of the high density interconnect structure 130 prior to separating the completed structure from the fabrication carrier 112. This bonding may preferably be done with a thermoplastic adhesive having a softening temperature or $T_G$ which is lower than that of the thermoplastic adhesives used to hold the chips in the cavities of the substrates and to laminate the first dielectric layer of the high density interconnect structure to the chips and substrates, but as close to that temperature as feasible in order to provide as high a temperature system as possible.

If the substrate of module 101 in FIG. 2 is to be bonded to the heat sink 108, such bonding may preferably be done prior to the beginning of assembly of the interconnect structure. Such early bonding is particularly desirable where the substrate and heat sink are compatible with the use of the direct bond copper process or any other high temperature bonding process, since that ensures that the support member and the substrate will remain bonded at all times and provides a high thermal conductivity thermal connection between the substrate and the heat sink. When that is done, the fabrication carrier is modified as shown in FIG. 10 (carrier 112*) to include a sufficiently deep cavity to admit the heat sink 108 while still placing the upper surface of the substrate on the same plane as the carrier surface and the surfaces of the other modules. If the heat sink is larger than the substrate in lateral dimensions, then the gaps which the high density interconnect structure must bridge can be minimized by placing removable support blocks 109 the same thickness as the substrate 110* on top of the heat sink adjacent to the substrate as shown in FIG. 10. These inserts are preferably prevented from bonding to the high density interconnect structure by any one of the techniques disclosed in related application Ser. No. 07/504,769.

While three modules 101–103 are illustrated in each of FIGS. 1, 2, 8 and 9, it will be recognized that additional modules may be included in the system simply by lengthening the fabrication support carrier and providing additional cavities for the substrates of those additional modules and by providing additional flexible portions in the interconnect structure to facilitate folding those portions of the interconnect structure during the process of stacking the modules. This multiple module assembly technique is also applicable to just two modules. Thus, this multiple module assembly technique is applicable to two or more modules.

If additional shielding between the input and output is found desirable, ground planes may be inserted between adjacent modules and/or individual modules may be enclosed in individual cans. Where that is done, an external metallic sealing layer on the high density interconnect structure is considered desirable in order to provide increased shielding of the interconnect structure itself in a manner similar to that taught in related application Ser. No. 07/454,546.

Employing the present invention for the fabrication of microwave systems provides maximum reliability in combination with minimum physical size and minimized feedback and cross-talk between output and input. In particular, since a single continuous interconnect structure interconnects all of the modules, high reliability is provided and a minimum of leakage occurs, particularly where maximum shielding is provided in the process of fabricating the interconnection structure. Further, since a flexible portion of the high density interconnect structure may be folded on itself (preferably around an appropriate radius mandrel) without significantly changing the characteristics of microwave transmission lines incorporated in that structure, electrically long microwave structures can be made physically small without introducing impedance discontinuities, impedance mismatches and the other operation impairing characteristics, problems or disadvantages which are present in prior art stacked microwave structures. In this structure, a microwave transmission line may be bent back over itself as a result of the bending of the flexible high density interconnect structure. This bending causes little or no change in the operating characteristics of the microwave transmission line because the radius of curvature is substantially greater than the thickness of the transmission line dielectric.

Where hermetic packaging of the overall microwave system is desired, the heat sink 108 of FIG. 2 may be the base of a hermetic package which is completed by the addition of a can or other appropriate enclosing structure. The extension of the high density interconnect structure through this hermetic can may preferably be rendered hermetic or pseudo-hermetic in accordance with the teachings of the related application Ser. No. 07/454,546 now abandoned.

More than one module may be disposed in a given tier of the stack of modules. This may be particularly desirable where some modules are substantially larger than others with the result that two small modules take about the same lateral space as one larger one.

In the illustrative embodiments a straight or linear arrangement of modules during high density interconnect structure fabrication has been illustrated. Other configuration in which the modules are arranged in an array with the high density interconnect structure having a cross or other more complex shape may also be used as is appropriate to the system's electrical structure and the physical configuration of the space in which the system must be disposed. When the modules of such a system are stacked by bending the flexible high density interconnect structure, modules which are adjacent along a straight high density interconnect structure branch may not be disposed as adjacent tiers in the stack because of an interleaved module from a different branch of the high density interconnect structure. Further, such a system may configured as two or more stacks all of which are interconnected by a single high density interconnect structure.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A microwave system comprising:
    a plurality of distinct microwave electronic modules with respective electrical contacts thereon;
    a flexible high density interconnect structure interconnecting said microwave electronic modules, said flexible high density interconnect structure including a dielectric layer having a side which is bonded to at least two of said microwave electronic modules and including flexible conductors on an opposite side of said dielectric layer supported by said dielectric layer and ohmically connected to said respective electrical contacts of said microwave electronic modules through via holes in said dielectric layer;
    said microwave electronic modules being disposed in a multi-tier stack by having said flexible high density interconnect structure being bent between adjacent tiers.

2. The microwave system recited in claim 1 further comprising:
    a flexible support member bonded to said flexible high density interconnect structure at a bend in said flexible high density interconnect structure, said flexible high density interconnect structure at the bend having an inside facing radially inwardly and an outside facing radially outwardly.

3. The microwave system recited in claim 2 wherein:
    said flexible support member is disposed on the outside of said high density interconnect structure at said bend.

4. The microwave system recited in claim 2 wherein:
    said flexible support member is bonded to the same side of said dielectric layer as said electronic modules.

5. The microwave system recited in claim 4 wherein:
    said flexible support member is disposed on the outside of said high density interconnect structure at said bend.

6. The microwave system recited in claim 4 wherein:
    said electronic modules are bonded to said dielectric layer by an adhesive material, and
    said flexible support member is bonded to said dielectric layer by the same adhesive material as bonds said electronic modules to said dielectric layer.

7. The microwave system recited in claim 6 wherein:
    said flexible support member is disposed at a bend in said flexible high density interconnect structure; and
    at said bend, said support member is disposed on the outside of said high density interconnect structure.

8. The microwave system recited in claim 4 further comprising:
    a second support member bonded to the opposite side of said structure from said electronic modules.

9. A microwave system comprising:
    a plurality of distinct microwave electronic modules with respective electrical contacts thereon;
    a flexible high density interconnect structure interconnecting said microwave electronic modules, said flexible high density interconnect structure including a dielectric layer having a side which is bonded to at least two of said microwave electronic modules and flexible conductors supported by said dielectric layer which are ohmically connected to said respective electrical contacts of said microwave electronic modules;
    said microwave electronic modules being disposed in a multi-tier stack by having said flexible high density interconnect structure being bent between adjacent tiers;
    a first flexible support member bonded to said flexible high density interconnect structure at a bend in said high density interconnect structure;
    a second flexible support member bonded to the opposite side of said structure from said electronic modules;
    said second flexible support member being disposed at another bend in said flexible high density interconnect structure, said flexible high density interconnect structure at said another bend having an inside facing radially inwardly and an outside facing radially outwardly; and said second flexible support member being disposed on the outside of said high density interconnect structure at said another bend.

10. The microwave system recited in claim 9 further comprising:

a heat sink disposed in thermal contact with one of said modules.

11. The microwave system recited in claim 10 wherein:

said stack has two ends and said module which is disposed in thermal contact with said heat sink is disposed at one end of said stack.

12. The electronic system recited in claim 10 wherein:
each of said modules has a face side bonded to said dielectric layer and a back side opposite the face side, and two sequential ones of said modules are disposed in back-to-back relation.

13. The microwave system recited in claim 12 wherein:

said back-to-back modules are disposed in back-to-back contact.

14. The microwave system recited in claim 12 wherein:

said flexible conductors of said high density interconnect structure include a microwave transmission line which is bent back over itself as a result of the bent configuration of the flexible high density interconnect structure between tiers of said stack.

15. The microwave system recited in claim 1 wherein:

said high density interconnect structure comprises a serpentine structure in which said modules are disposed between bends in said serpentine structure.

16. The microwave system recited in claim 15 wherein:

said flexible conductors of said high density interconnect structure include a microwave transmission line which is bent back over itself as a result of the bent configuration of the flexible high density interconnect structure.

17. The microwave system recited in claim 1 wherein:

said flexible conductors of said high density interconnect structure include a microwave transmission line which is bent back over itself as a result of the bent configuration of the flexible high density interconnect structure.

18. The microwave system recited in claim 1 wherein:

two sequential ones of said modules are disposed back-to-back relation.

19. The microwave system recited in claim 18 wherein:

said back-to-back modules are disposed in back-to-back contact.

20. The microwave system recited in claim 1 wherein:

said modules are electrically connected in series.

21. The microwave system recited in claim 1 wherein:

said modules are electrically connected in parallel.

22. The microwave system recited in claim 1 wherein:

said system includes a heat spreading member; and
a first one of said modules is disposed in thermal contact with said heat spreading member.

23. A microwave system comprising:

a plurality of distinct microwave electronic modules with respective electrical contacts thereon;

a flexible high density interconnect structure interconnecting said microwave electronic modules, said flexible high density interconnect structure including a dielectric layer having a side which is bonded to at least two of said microwave electronic modules and including flexible conductors on an opposite side of said dielectric layer supported by said dielectric layer and ohmically connected to said respective electrical contacts of said microwave electronic modules through via holes in said dielectric layer;

said microwave electronic modules being disposed in a multi-tier stack by having said flexible high density interconnect structure being bent between adjacent tiers;

a support mandrel having a curved surface; and
a portion of said flexible high density interconnect structure being disposed in contact with said curved surface where said flexible high density interconnect structure is bent between two adjacent ones of said modules.

24. A method of assembling a microwave system comprising:

providing a plurality of components;
arranging said components in groups on a support structure, each of said groups comprising the components of a different microwave electronic module;

physically and electrically interconnecting said components with a high density interconnect structure including a dielectric layer having a side which is bonded to at least two of said microwave electronic modules and including flexible conductors on an opposite side of said dielectric layer supported by said dielectric layer and ohmically connected to said respective electrical contacts of said microwave electronic modules through via holes in said dielectric layer;

rendering a portion of said high density interconnect structure disposed between two adjacent ones of said microwave electronic modules flexible; and bending said flexible portion of said high density interconnect structure to place said two adjacent ones of said microwave electronic modules in a stack.

25. The method recited in claim 24 wherein the step of bending comprises:

providing a support mandrel; and
bending said flexible portion of said high density interconnect structure along a curved surface of the support mandrel.

26. The method recited in claim 24 wherein the step of physically and electrically interconnecting said components includes:

bonding such components to one side of the high density interconnect structure;
and which method further comprises the step of:
bonding a support member to the side of said high density interconnect structure opposite said components.

* * * * *